United States Patent
Zhu et al.

(10) Patent No.: US 8,895,449 B1
(45) Date of Patent: Nov. 25, 2014

(54) DELICATE DRY CLEAN

(71) Applicant: Applied Materials, Inc., Santa Clara, CA (US)

(72) Inventors: Lina Zhu, San Jose, CA (US); Sean S. Kang, San Ramon, CA (US); Srinivas D. Nemani, Sunnyvale, CA (US); Chia-Ling Kao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/966,453

(22) Filed: Aug. 14, 2013

Related U.S. Application Data

(60) Provisional application No. 61/823,995, filed on May 16, 2013.

(51) Int. Cl.
  H01L 21/302   (2006.01)
  H01L 21/461   (2006.01)
  H01L 21/3105  (2006.01)
  H01L 21/311   (2006.01)

(52) U.S. Cl.
  CPC ...... *H01L 21/3105* (2013.01); *H01L 21/31116* (2013.01)
  USPC ............ 438/706; 438/723; 438/743; 216/58; 216/73

(58) Field of Classification Search
  None
  See application file for complete search history.

(56) References Cited

U.S. PATENT DOCUMENTS

| | | | |
|---|---|---|---|
| 2,369,620 A | 2/1945 | Sullivan et al. | |
| 3,451,840 A | 6/1969 | Hough | |
| 3,937,857 A | 2/1976 | Brummett et al. | |
| 4,006,047 A | 2/1977 | Brummett et al. | |
| 4,209,357 A | 6/1980 | Gorin et al. | |
| 4,214,946 A | 7/1980 | Forget et al. | |
| 4,232,060 A | 11/1980 | Mallory, Jr. | |
| 4,234,628 A | 11/1980 | DuRose | |
| 4,265,943 A | 5/1981 | Goldstein et al. | |
| 4,364,803 A | 12/1982 | Nidola et al. | |
| 4,368,223 A | 1/1983 | Kobayashi et al. | |

(Continued)

FOREIGN PATENT DOCUMENTS

| | | |
|---|---|---|
| CN | 1375575 | 10/2002 |
| CN | 1412861 A | 4/2003 |

(Continued)

OTHER PUBLICATIONS

C.K. Hu, et al. "Reduced Electromigration of Cu Wires by Surface Coating" Applied Physics Letters, vol. 81, No. 10, Sep. 2, 2002- pp. 1782-1784.

(Continued)

*Primary Examiner* — Duy Deo
(74) *Attorney, Agent, or Firm* — Kilpatrick Townsend & Stockton LLP

(57) ABSTRACT

A method of selectively removing fluorocarbon layers from overlying low-k dielectric material is described. These protective plasma treatments (PPT) are delicate alternatives to traditional post-etch treatments (PET). The method includes sequential exposure to (1) a local plasma formed from a silicon-fluorine precursor followed by (2) an exposure to plasma effluents formed in a remote plasma from a fluorine-containing precursor. The remote plasma etch (2) has been found to be highly selective of the residual material following the local plasma silicon-fluorine exposure. The sequential process (1)-(2) avoids exposing the low-k dielectric material to oxygen which would undesirably increase its dielectric constant.

17 Claims, 6 Drawing Sheets

(56) References Cited

U.S. PATENT DOCUMENTS

| | | |
|---|---|---|
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. et al. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Shacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |

(56) References Cited

U.S. PATENT DOCUMENTS

| | | | |
|---|---|---|---|
| 5,904,827 | A | 5/1999 | Reynolds |
| 5,907,790 | A | 5/1999 | Kellam |
| 5,910,340 | A | 6/1999 | Uchida et al. |
| 5,913,140 | A | 6/1999 | Roche et al. |
| 5,913,147 | A | 6/1999 | Dubin et al. |
| 5,915,190 | A | 6/1999 | Pirkle |
| 5,920,792 | A | 7/1999 | Lin |
| 5,932,077 | A | 8/1999 | Reynolds |
| 5,933,757 | A | 8/1999 | Yoshikawa et al. |
| 5,935,334 | A | 8/1999 | Fong et al. |
| 5,937,323 | A | 8/1999 | Orczyk et al. |
| 5,939,831 | A | 8/1999 | Fong et al. |
| 5,942,075 | A | 8/1999 | Nagahata et al. |
| 5,944,902 | A | 8/1999 | Redeker et al. |
| 5,951,601 | A | 9/1999 | Lesinski et al. |
| 5,951,776 | A | 9/1999 | Selyutin et al. |
| 5,953,635 | A | 9/1999 | Andideh |
| 5,968,610 | A | 10/1999 | Liu et al. |
| 5,969,422 | A | 10/1999 | Ting et al. |
| 5,976,327 | A | 11/1999 | Tanaka |
| 5,990,000 | A | 11/1999 | Hong et al. |
| 5,990,013 | A | 11/1999 | Berenguer et al. |
| 5,993,916 | A | 11/1999 | Zhao et al. |
| 6,004,884 | A | 12/1999 | Abraham |
| 6,010,962 | A | 1/2000 | Liu et al. |
| 6,013,191 | A | 1/2000 | Nasser-Faili et al. |
| 6,013,584 | A | 1/2000 | M'Saad |
| 6,015,724 | A | 1/2000 | Yamazaki |
| 6,015,747 | A | 1/2000 | Lopatin et al. |
| 6,020,271 | A | 2/2000 | Yanagida |
| 6,030,666 | A | 2/2000 | Lam et al. |
| 6,030,881 | A | 2/2000 | Papasouliotis et al. |
| 6,035,101 | A | 3/2000 | Sajoto et al. |
| 6,037,018 | A | 3/2000 | Jang et al. |
| 6,037,266 | A | 3/2000 | Tao et al. |
| 6,039,851 | A | 3/2000 | Iyer |
| 6,053,982 | A | 4/2000 | Halpin et al. |
| 6,059,643 | A | 5/2000 | Hu et al. |
| 6,063,683 | A | 5/2000 | Wu et al. |
| 6,063,712 | A | 5/2000 | Gilton et al. |
| 6,065,424 | A | 5/2000 | Shacham-Diamand et al. |
| 6,072,227 | A | 6/2000 | Yau et al. |
| 6,077,780 | A | 6/2000 | Dubin |
| 6,080,529 | A | 6/2000 | Ye et al. |
| 6,083,344 | A | 7/2000 | Hanawa et al. |
| 6,086,677 | A | 7/2000 | Umotoy et al. |
| 6,087,278 | A | 7/2000 | Kim et al. |
| 6,093,594 | A | 7/2000 | Yeap et al. |
| 6,099,697 | A | 8/2000 | Hausmann |
| 6,107,199 | A | 8/2000 | Allen et al. |
| 6,110,530 | A | 8/2000 | Chen et al. |
| 6,110,836 | A | 8/2000 | Cohen et al. |
| 6,110,838 | A | 8/2000 | Loewenstein |
| 6,113,771 | A | 9/2000 | Landau et al. |
| 6,117,245 | A | 9/2000 | Mandrekar et al. |
| 6,136,163 | A | 10/2000 | Cheung et al. |
| 6,136,685 | A | 10/2000 | Narwankar et al. |
| 6,136,693 | A | 10/2000 | Chan et al. |
| 6,140,234 | A | 10/2000 | Uzoh et al. |
| 6,144,099 | A | 11/2000 | Lopatin et al. |
| 6,147,009 | A | 11/2000 | Grill et al. |
| 6,149,828 | A | 11/2000 | Vaartstra |
| 6,150,628 | A | 11/2000 | Smith et al. |
| 6,153,935 | A | 11/2000 | Edelstein et al. |
| 6,165,912 | A | 12/2000 | McConnell et al. |
| 6,167,834 | B1 | 1/2001 | Wang et al. |
| 6,169,021 | B1 | 1/2001 | Akram et al. |
| 6,170,428 | B1 | 1/2001 | Redeker et al. |
| 6,171,661 | B1 | 1/2001 | Zheng et al. |
| 6,174,812 | B1 | 1/2001 | Hsuing et al. |
| 6,176,198 | B1 | 1/2001 | Kao et al. |
| 6,177,245 | B1 | 1/2001 | Ward et al. |
| 6,179,924 | B1 | 1/2001 | Zhao et al. |
| 6,180,523 | B1 | 1/2001 | Lee et al. |
| 6,182,602 | B1 | 2/2001 | Redeker et al. |
| 6,189,483 | B1 | 2/2001 | Ishikawa et al. |
| 6,190,233 | B1 | 2/2001 | Hong et al. |
| 6,191,026 | B1 | 2/2001 | Rana et al. |
| 6,194,038 | B1 | 2/2001 | Rossman |
| 6,197,181 | B1 | 3/2001 | Chen |
| 6,197,364 | B1 | 3/2001 | Paunovic et al. |
| 6,197,680 | B1 | 3/2001 | Lin et al. |
| 6,197,688 | B1 | 3/2001 | Simpson |
| 6,197,705 | B1 | 3/2001 | Vassiliev |
| 6,203,863 | B1 | 3/2001 | Liu et al. |
| 6,204,200 | B1 | 3/2001 | Shieh et al. |
| 6,217,658 | B1 | 4/2001 | Orczyk et al. |
| 6,228,233 | B1 | 5/2001 | Lakshmikanthan et al. |
| 6,228,751 | B1 | 5/2001 | Yamazaki et al. |
| 6,228,758 | B1 | 5/2001 | Pellerin et al. |
| 6,235,643 | B1 | 5/2001 | Mui et al. |
| 6,238,513 | B1 | 5/2001 | Arnold et al. |
| 6,238,582 | B1 | 5/2001 | Williams et al. |
| 6,241,845 | B1 | 6/2001 | Gadgil et al. |
| 6,242,349 | B1 | 6/2001 | Nogami et al. |
| 6,245,670 | B1 | 6/2001 | Cheung et al. |
| 6,251,236 | B1 | 6/2001 | Stevens |
| 6,251,802 | B1 | 6/2001 | Moore et al. |
| 6,258,220 | B1 | 7/2001 | Dordi et al. |
| 6,258,223 | B1 | 7/2001 | Cheung et al. |
| 6,258,270 | B1 | 7/2001 | Hilgendorff et al. |
| 6,261,637 | B1 | 7/2001 | Oberle |
| 6,277,752 | B1 | 8/2001 | Chen |
| 6,277,763 | B1 | 8/2001 | Kugimiya et al. |
| 6,281,135 | B1 | 8/2001 | Han et al. |
| 6,291,282 | B1 | 9/2001 | Wilk et al. |
| 6,291,348 | B1 | 9/2001 | Lopatin et al. |
| 6,303,418 | B1 | 10/2001 | Cha et al. |
| 6,312,995 | B1 | 11/2001 | Yu |
| 6,313,035 | B1 | 11/2001 | Sandhu et al. |
| 6,319,387 | B1 | 11/2001 | Krishnamoorthy et al. |
| 6,323,128 | B1 | 11/2001 | Sambucetti et al. |
| 6,335,261 | B1 | 1/2002 | Natzle et al. |
| 6,335,288 | B1 | 1/2002 | Kwan et al. |
| 6,340,435 | B1 | 1/2002 | Bjorkman et al. |
| 6,342,733 | B1 | 1/2002 | Hu et al. |
| 6,344,410 | B1 | 2/2002 | Lopatin et al. |
| 6,350,320 | B1 | 2/2002 | Sherstinsky et al. |
| 6,351,013 | B1 | 2/2002 | Luning et al. |
| 6,364,949 | B1 | 4/2002 | Or et al. |
| 6,364,954 | B2 | 4/2002 | Umotoy et al. |
| 6,364,957 | B1 | 4/2002 | Schneider et al. |
| 6,372,657 | B1 | 4/2002 | Hineman et al. |
| 6,375,748 | B1 | 4/2002 | Yudovsky et al. |
| 6,379,575 | B1 | 4/2002 | Yin et al. |
| 6,383,951 | B1 | 5/2002 | Li |
| 6,387,207 | B1 | 5/2002 | Janakiraman et al. |
| 6,395,150 | B1 | 5/2002 | Van Cleemput et al. |
| 6,403,491 | B1 | 6/2002 | Liu et al. |
| 6,416,647 | B1 | 7/2002 | Dordi et al. |
| 6,432,819 | B1 | 8/2002 | Pavate et al. |
| 6,436,816 | B1 | 8/2002 | Lee et al. |
| 6,440,863 | B1 | 8/2002 | Tsai et al. |
| 6,441,492 | B1 | 8/2002 | Cunningham |
| 6,446,572 | B1 | 9/2002 | Brcka |
| 6,448,537 | B1 | 9/2002 | Nering |
| 6,458,718 | B1 | 10/2002 | Todd |
| 6,462,371 | B1 | 10/2002 | Weimer et al. |
| 6,465,366 | B1 | 10/2002 | Nemani et al. |
| 6,477,980 | B1 | 11/2002 | White et al. |
| 6,479,373 | B2 | 11/2002 | Dreybrodt et al. |
| 6,488,984 | B1 | 12/2002 | Wada et al. |
| 6,494,959 | B1 | 12/2002 | Samoilov et al. |
| 6,500,728 | B1 | 12/2002 | Wang |
| 6,503,843 | B1 | 1/2003 | Xia et al. |
| 6,506,291 | B2 | 1/2003 | Tsai et al. |
| 6,516,815 | B1 | 2/2003 | Stevens et al. |
| 6,518,548 | B2 | 2/2003 | Sugaya et al. |
| 6,527,968 | B1 | 3/2003 | Wang et al. |
| 6,528,409 | B1 | 3/2003 | Lopatin et al. |
| 6,531,377 | B2 | 3/2003 | Knorr et al. |
| 6,537,733 | B2 | 3/2003 | Nemani et al. |
| 6,541,397 | B1 | 4/2003 | Bencher |
| 6,541,671 | B1 | 4/2003 | Martinez et al. |

(56) References Cited

U.S. PATENT DOCUMENTS

| | | |
|---|---|---|
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Campana et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,575,007 B2 * | 8/2009 | Tang et al. .................... 134/1.1 |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0055842 A1 | 12/2001 | Uh et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0124867 A1 | 9/2002 | Kim et al. |
| 2002/0177322 A1 | 11/2002 | Li et al. |
| 2002/0187655 A1 | 12/2002 | Tan et al. |
| 2002/0197823 A1 | 12/2002 | Yoo et al. |
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |

(56) References Cited

U.S. PATENT DOCUMENTS

| | | |
|---|---|---|
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Su |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0182383 A1* | 7/2008 | Lee et al. .................. 438/437 |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0170221 A1* | 7/2009 | Jacques et al. .................. 438/6 |
| 2009/0189246 A1 | 7/2009 | Wu et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0277874 A1* | 11/2009 | Rui et al. .................. 216/67 |
| 2009/0280650 A1 | 11/2009 | Lubomirsky et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0144140 A1 | 6/2010 | Chandrashekar et al. |
| 2010/0173499 A1 | 7/2010 | Tao et al. |
| 2010/0187534 A1 | 7/2010 | Nishi et al. |
| 2010/0187588 A1 | 7/2010 | Kim et al. |
| 2010/0330814 A1 | 12/2010 | Yokota et al. |
| 2011/0008950 A1 | 1/2011 | Xu |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0159690 A1 | 6/2011 | Chandrashekar et al. |

(56) References Cited

U.S. PATENT DOCUMENTS

| | | | |
|---|---|---|---|
| 2011/0165771 A1 | 7/2011 | Ring et al. |
| 2011/0195575 A1 | 8/2011 | Wang |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0260533 A1 | 10/2013 | Sapre et al. |

FOREIGN PATENT DOCUMENTS

| | | | |
|---|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JE | H11-204442 | 7/1999 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09-153481 | 6/1997 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2002-256235 | 9/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 1020030081177 | 10/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 1020080063988 A | 7/2008 |
| KR | 10-2010-0013980 A | 2/2010 |
| KR | 10-2010-0074508 A | 7/2010 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 9954920 A2 | 10/1999 |
| WO | 99/62108 A2 | 12/1999 |
| WO | 00/13225 A1 | 3/2000 |
| WO | 00/22671 | 4/2000 |
| WO | 0022671 | 4/2000 |
| WO | 2011/115761 A2 | 9/2001 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/139435 A2 | 11/2011 |
| WO | 2012/018449 A2 | 2/2012 |
| WO | 2012/125654 A2 | 9/2012 |

OTHER PUBLICATIONS

European Search Report dated May 23, 2006 for EP Application No. 05251143.3.

European Examination Report dated Nov. 13, 2007 for EP Application No. 05251143.3 (APPM/008802EP).

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

(56) References Cited

OTHER PUBLICATIONS

Musaka, "Single Step Gap Filling Technology fo Subhalf Micron Metal Spacings on Plasma Enhanced TEOS/O$_2$ Chemical Vapor Deposition System," Extended Abstracts of the 1993 International Conference on Solid State Devices and Materials pages, 1993, 510-512.
Pearlstein, Fred. "Electroless Plating," J. Res. Natl. Bur. Stan., Ch. 31 (1974), pp. 710-747.
Saito, et al., "Electroless deposition of Ni—B, Co—B and Ni—Co—B alloys using dimethylamineborane as a reducing agent," Journal of Applied Electrochemistry 28 (1998), pp. 559-563.
Schacham-Diamond, et al., "Electrochemically deposited thin film alloys for ULSI and MEMS applications," Microelectronic Engineering 50 (2000), pp. 525-531.
Schacham-Diamond, et al. "Material properties of electroless 100-200 nm thick CoWP films," Electrochemical Society Proceedings, vol. 99-34, pp. 102-110.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003,30 pages see pp. 717-718, John Wiley & Sons, Inc.
Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.
Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3. I (APPM/008802 EPC E).
Fukada et al., "Preparation of SiOF Films with Low Dielectric Constant by ECR Plasma Cvd," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226; APPM8802PC02).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.
Jung, et al., "Patterning with amorphous carbon spacer for expanding the resolution limit of current lithography tool", Proc. SPIE , 2007, 9 pages, vol. 6520, 65201C.
Laxman, "Low ∈ Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of SiO$_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, pp. 118-123.
S.M. Sze, VLSI Technology, McGraw-Hill Book Company, pp. 107, 108.
C.C. Tang and D. W. Hess, Tungsten Etching in CF4 and SF6 Discharges, J. Electrochem. Soc., 1984, 131 (1984) p. 115-120.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3),May/Jun. 1998, pp. 1582-1587.
Wolf et al.; Silicon Processing for the VLSI Era; vol. 1; 1986; Lattice Press, pp. 546, 547, 618, 619.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

* cited by examiner

DELICATE DRY CLEAN

CROSS-REFERENCES TO RELATED APPLICATIONS

This application claims the benefit of U.S. Prov. Pat. App. No. 61/823,995 filed May 16, 2013, and titled "DELICATE DRY CLEAN" by Zhu et al., which is hereby incorporated herein in its entirety by reference for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

Integrated circuit fabrication methods have reached a point where many hundreds of millions of transistors are routinely formed on a single chip. Each new generation of fabrication techniques and equipment are allowing commercial scale fabrication of ever smaller and faster transistors, but also increase the difficulty to make even smaller, faster circuit elements. The shrinking dimensions of circuit elements, now well below the 50 nm threshold, has caused chip designers to look for new low-resistivity conductive materials and new low-dielectric constant (i.e., low-k) insulating materials to improve (or simply maintain) the electrical performance of the integrated circuit.

Parasitic capacitance becomes a significant impediment to transistor switching rate as the number of transistors per area is increased. Capacitance exists between all adjacent electrically isolated conductors within an integrated circuit and may limit the switching rate regardless of whether the conducting portions are at the "front end" or the "back end" of the manufacturing process flow.

Thus, there is a need for new techniques and materials to form low-k material between adjacent conductors. One class of materials used to provide low-k separation between conductors is oxidized organo-silane films, such as the Black Diamond films commercially available from Applied Materials, Inc. of Santa Clara, Calif. These films have lower dielectric constants (e.g., about 3.5 or less) than conventional spacer materials like silicon oxides and nitrides. Unfortunately, some new processes involve exposing low-k films to environments which can increase the effective dielectric constant and limit device performance.

Thus there is a need for new processes which maintain a lower effective dielectric constant following exposure of a low-k film to these environments.

BRIEF SUMMARY OF THE INVENTION

A method of selectively removing fluorocarbon layers from overlying low-k dielectric material is described. These protective plasma treatments (PPT) are delicate alternatives to traditional post-etch treatments (PET). The method includes sequential exposure to (1) a local plasma formed from a silicon-fluorine precursor followed by (2) an exposure to plasma effluents formed in a remote plasma from a fluorine-containing precursor. The remote plasma etch (2) has been found to be highly selective of the residual material following the local plasma silicon-fluorine exposure. The sequential process (1)-(2) avoids exposing the low-k dielectric material to oxygen which would undesirably increase its dielectric constant.

Embodiments of the invention include methods of removing a fluorocarbon layer from a low-k dielectric layer on a patterned substrate, the method comprising two sequential steps: (i) treating the patterned substrate with a local plasma formed from a silicon-and-fluorine-containing precursor, wherein the operation of treating the patterned substrate removes the fluorocarbon layer from patterned substrate and forms a fluorinated silicon oxide layer on the low-k dielectric layer and the local plasma is formed by applying a local plasma power, and (ii) flowing a fluorine-containing precursor into a remote plasma region fluidly coupled to a substrate processing region while forming a remote plasma in the remote plasma region to produce plasma effluents. The methods include forming the remote plasma in the remote plasma region to produce the plasma effluents comprises striking an RF plasma having an RF plasma power to the plasma region and etching the fluorinated silicon oxide layer by flowing the plasma effluents into the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of selectively removing fluorocarbon layers from overlying low-k dielectric material is described. These protective plasma treatments (PPT) are delicate alternatives to traditional post-etch treatments (PET). The method includes sequential exposure to (1) a local plasma formed from a silicon-fluorine precursor followed by (2) an exposure to plasma effluents formed in a remote plasma from a fluorine-containing precursor. The remote plasma etch (2) has been found to be highly selective of the residual material following the local plasma silicon-fluorine exposure. The sequential process (1)-(2) avoids exposing the low-k dielectric material to oxygen which would undesirably increase its dielectric constant.

The inventors have found new ways to selectively remove dielectric etch remnants without harming underlying low-k and ultra low-k (ULK) dielectric material. A two-step sequence includes (i) a local plasma treatment step which transforms/replaces etch-remnant fluorocarbon material into/with fluorinated silicon oxide. A delicate remote fluorine-based etch has been determined to be highly selective of the transformed/replaced fluorinated silicon oxide layer. Thus, a subsequent (ii) etch step involves remote excitation of a fluorine-containing precursor and transferal of the plasma effluents into a substrate processing region housing the substrate. The plasma effluents react with the exposed fluorinated silicon oxide and preferentially remove the transformed/replaced layer from the patterned substrate without increasing the dielectric constant of the underlying low-k material in embodiments. Traditional post-etch treatments (PET) which have been used previously to remove fluorocarbons have relied on "ashing" (i.e. exposure to oxygen) which raises the surface dielectric constant of the underlying low-k dielectric.

Figure 1:
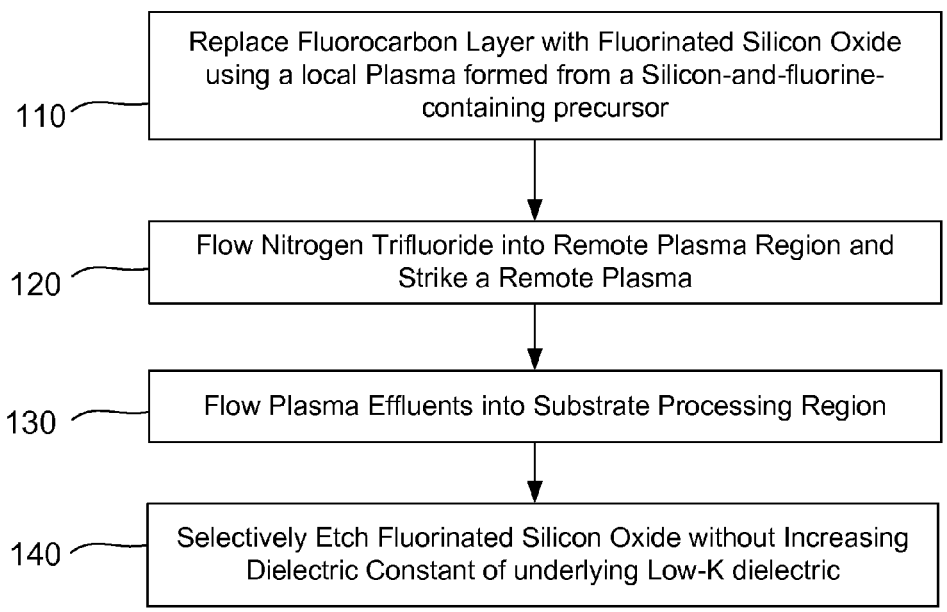
FIG. 1 is a flow chart of a protective plasma treatment according to disclosed embodiments.
Figure 2A:
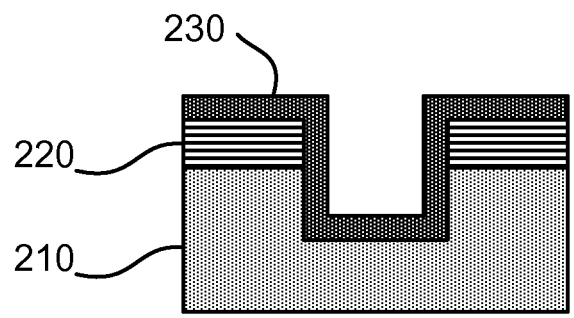
FIG. 2A-2C show cross-sectional views of a device at various stages during a protective plasma treatment according to disclosed embodiments.
Figure 2B:
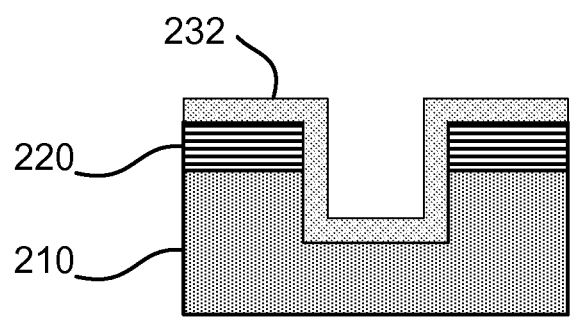
Figure 2C:
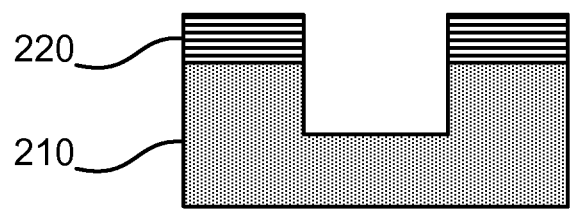

In order to better understand and appreciate the invention, reference is now made to FIG. 1 which is a flow chart of an exemplary protective plasma treatment according to disclosed embodiments. Reference will concurrently be made to FIGS. 2A-2C which shows cross-sectional views of an exemplary device at various stages during protective plasma treatments. Prior to the first operation, a structure is formed in a patterned substrate. The structure includes a titanium nitride mask (TiN mask) 220 over an ultra-low-k (ULK) dielectric 210. The ULK dielectric 210 is etched in regions which are left uncovered by TiN mask 220. The etch process leaves fluorocarbon 230 residue behind prior to the start of the removal processes described herein. The structure formed possesses an exposed roughly conformal layer of leftover fluorocarbon 230 on TiN mask 220 and ULK dielectric 210. The etch process described removes fluorocarbon 230 without damaging (raising the dielectric constant of) ULK dielectric 210.

The patterned substrate is then delivered into a substrate processing region. Silicon tetrafluoride is then flowed into the substrate processing region housing the patterned substrate (operation 110). The silicon tetrafluoride is excited in a local capacitively-coupled plasma within the substrate processing region and the patterned substrate is treated with the local plasma. A DC voltage may be applied in addition to a radio-frequency AC primary excitation to form the local plasma. The substrate processing region may generally include a silicon-and-fluorine-containing precursor as well as other inert species, such as argon and helium, which may prove beneficial to stability, uniformity and strikability of the plasma. The substrate processing region may be devoid of reactive species containing nitrogen or oxygen, in disclosed embodiments, in order to suppress a detrimental potential rise in dielectric constant of ULK dielectric 210 during the treatment step (operation 110). The inventors have determined that oxygen from the ULK is sufficient to supply the oxygen to the fluorinated silicon oxide in disclosed embodiments. The treatment step using silicon tetrafluoride is the first step in a two step sequence (the second step includes operations 120-140 described below). The treatment operation 110 alters or replaces fluorocarbon layer 230 while forming a fluorinated silicon oxide layer 232 in place of fluorocarbon layer 230. The inventors have found that fluorinated silicon oxide layer 232 is much easier to delicately remove than fluorocarbon layer 230.

A flow of nitrogen trifluoride is then introduced into a plasma region separate from the substrate processing region (operation 120) where the nitrogen trifluoride is excited in a remote plasma struck within the separate plasma region. The separate plasma region may be referred to as a remote plasma region herein and may be within a distinct module from the processing chamber or a compartment within the processing chamber separated from the substrate processing region by a permeable barrier. In general, a fluorine-containing precursor may be flowed into the remote plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, fluorinated hydrocarbons, sulfur hexafluoride, carbon tetrafluoride and xenon difluoride. In embodiments which do not form solid residue, broad substrate temperature ranges are possible. The temperature of the substrate during operations 120-130 may be between 0° C. and 200° C. or between 10° C. and 150° C. in disclosed embodiments.

The plasma effluents formed in the remote plasma region are then flowed into the substrate processing region (operation 130) and the patterned substrate is selectively etched (operation 140). The plasma effluents may enter the substrate processing region through through-holes in a showerhead which separates the remote plasma region from the substrate processing region. Fluorinated silicon oxide layer 232 is removed during operation 140 of the etch step. The etch step ideally is stopped once the etch step removes fluorinated silicon oxide layer 232. However, a slight over-etch is canonical as a result of nonuniformities and other real-world considerations. The underlying ULK dielectric 210 is exposed to the plasma effluents for a finite period of time predominantly during the over-etch. The etch chemistries disclosed herein have been carefully selected to avoid compromising ULK dielectric 210. A compromised ULK dielectric 210 would raise the near surface dielectric constant and therefore would throttle back peak clock frequencies. The reactive chemical species are removed from the substrate processing region and then the substrate is removed from the processing region.

The remote plasma region may have hydrogen-containing precursors present (flowed into the remote plasma region concurrently) or may be devoid of hydrogen during the etching step of the compound etch (operations 120-140) in disclosed embodiments. A presence of hydrogen (e.g. in the form of ammonia) during the etching step may change the mechanism involved in the etch as discussed in the exemplary equipment section. Regardless of whether hydrogen is present, the temperature of the substrate may be between about −20° C. and about 200° C. during both the treatment step and the etching step. In embodiments of the invention, a hydrogen-containing precursor is provided along with the fluorine-containing precursor into the remote plasma region and the temperature is relatively low (e.g. below 90° C.). Under such circumstances, solid residue may form on fluorinated silicon oxide layer 230 possibly according to hypothetical chemical mechanisms described in the exemplary equipment section. Any solid residue etch by-products which remain on the surface may then be removed by sublimation.

The temperature of the patterned substrate throughout the sequence of operations 120-130 may be below one of 90° C., 80° C., 70° C., 60° C., 50° C., 40° C. or 35° C., in disclosed embodiments. The substrate may then be heated after the etch step in order to sublimate any surface-resident solid by-products by raising the temperature of the patterned substrate above one of 90° C., 100° C., 120° C. or 140° C., in disclosed embodiments. The duration of the sublimation may be above one of 45 seconds, 60 seconds, 75 seconds, 90 seconds or 120 seconds, in disclosed embodiments. Sublimation may be carried out in the same substrate processing region used for the etching operation, in which case the patterned substrate is finally removed from the substrate processing region after following sublimation.

Generally speaking, the silicon tetrafluoride used in the exemplary process of FIG. 1 may be any silicon-and-fluorine-containing precursor, such as $Si_2F_6$, $SiH_2F_2$ and the like. The silicon-and-fluorine-containing precursor may be a partially fluorinated silane, disilane, higher order silane or may be a fully fluorinated silane, disilane, higher order silane, in embodiments of the invention. The silicon-and-fluorine-containing precursor may be accompanied by one or more of neon, helium, argon and xenon. The local plasma may consist only of the silicon-and-fluorine-containing precursor and inert gases.

The method includes applying energy in the form of a plasma to the silicon-and-fluorine-containing precursor (e.g. silicon tetrafluoride) while in the substrate processing region to generate the plasma effluents used to treat the substrate (operation 110). The plasma may be generated using known techniques (e.g., radio frequency excitations, capacitively-coupled power, inductively coupled power, and the like). In an embodiment, the energy is applied using a capacitively-coupled plasma unit. The local plasma power may be between about 10 watts and about 500 watts, between about 20 watts and about 400 watts, between about 30 watts and about 300 watts, or between about 50 watts and about 200 watts in embodiments of the invention.

A DC accelerating voltage may and may not be applied, in embodiments, to assist the local plasma treatment of the patterned substrate in operation 110. When used, the local plasma may be formed by applying a DC bias power such that the local plasma power comprises both an AC portion and a DC portion. The DC bias power supplies a DC accelerating voltage which may be greater than 200 volts, greater than 300 volts, greater than 400 volts, greater than 500 volts, greater than 600 volts, or greater than 700 volts in embodiments of the invention. In order to more fully preserve the integrity of ULK dielectric 210, the DC voltage may be less than 2000 volts, less than 1500 volts, less than 1300 volts or less than 1100 volts. The pressure in the substrate processing region may be between about 0.5 mTorr and about 50 mTorr, between about 2 mTorr and about 200 mTorr or between about 5 mTorr and about 100 mTorr in disclosed embodiments.

The method also includes applying energy to the fluorine-containing precursor while in the remote plasma region to generate the plasma effluents (operation 120). As would be appreciated by one of ordinary skill in the art, the plasma may include a number of charged and neutral species including radicals and ions. The plasma may be generated using known techniques (e.g., radio frequency excitations, capacitively-coupled power, inductively coupled power, and the like). In an embodiment, the energy is applied using a capacitively-coupled plasma unit. The remote plasma source power may be between about 300 watts and about 5000 watts, between about 500 watts and about 3000 watts, between about 750 watts and about 2000 watts, or between about 900 watts and about 1500 watts in embodiments of the invention. The etch rate has been observed by the inventors to generally increase as RF power is raised from about 300 watts to about 1000 watts, after which the etch rate plateaus. Operating at about 1000 watts or above produces a process which is substantially insensitive to fluctuations in plasma power. Exceeding 1000 watts significantly (e.g. above 1500 watts) does not harm the process, but sacrifices energy efficiency. As with all complementary ranges provided herein, upper limits may be combined with any suitable lower limits to obtain additional disclosed embodiments. The pressure in the remote plasma region may be such that the pressure in the substrate processing region ends up between about 0.01 Torr and about 50 Torr or between about 0.1 Torr and about 5 Torr in disclosed embodiments.

In some circumstances, a fluorine-containing precursor is combined with a hydrogen-containing precursor in the remote plasma region when the plasma is formed. For relatively low substrate temperatures, the reaction results in the formation of solid residue by-product which is sublimated away following the etching step. Lower plasma powers may be used for this reaction since the plasma effluents are more stable. The RF power applied to form the remote plasma may be between about 1 watt and about 5000 watts, between about 1 watt and about 1000 watts, between about 5 watts and about 600 watts, between about 10 watts and about 300 watts or between about 20 watts and about 100 watts in disclosed embodiments.

Especially when a fluorine-containing precursor is used without a hydrogen-containing precursor, an ion suppressor may be used to filter ions from the plasma effluents during passage from the remote plasma region to the substrate processing region. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region. However, in disclosed embodiments, essentially no ionic species penetrate to the substrate surface. Using the plasma effluents, a high etch rate selectivity of silicon relative to silicon oxide, silicon nitride and many alternative materials may be achieved.

The RF frequency applied for either the local or remote plasmas described herein may be low RF frequencies less than about 200 kHz, high RF frequencies between about 10 MHz and about 15 MHz, or microwave frequencies greater than or about 1 GHz in disclosed embodiments.

The two-step etches presented herein are used to clean a patterned substrate after a pattern transfer step. The disclosed two-step etch techniques have been developed for use with narrow trenches and gaps, which are uniquely benefitted by maintaining low-k on ULK dielectric separators used in miniaturized integrated circuits. Trench or gap widths may be less than or about 70 nm, less than or about 60 nm, less than or about 50 nm, less than or about 40 nm, less than or about 30 nm, less than or about 25 nm, less than or about 20 nm or less than or about 15 nm in embodiments of the invention.

The flow of either the silicon-and-fluorine-containing precursor and, separately, the fluorine-containing precursor may further include one or more relatively inert gases such as He, $N_2$, Ar. The inert gas can be used to improve plasma stability, process uniformity and the like. Argon is helpful, as an additive, to promote the formation of a (stable) plasma. Process uniformity is generally increased when helium is included. These additives are present in embodiments throughout this specification.

In disclosed embodiments, the fluorine-containing gas (e.g. $NF_3$) is supplied at a flow rate of between about 5 sccm (standard cubic centimeters per minute) and 400 sccm, He at a flow rate of between about 0 slm (standard liters per minute) and 3 slm, and $N_2$ at a flow rate of between about 0 slm and 3 slm. One of ordinary skill in the art would recognize that other gases and/or flows may be used depending on a number of factors including processing chamber configuration, substrate size, geometry and layout of features being etched, and the like.

Additional process parameters are disclosed in the course of describing an exemplary processing chamber and system.

Exemplary Processing System

Figure 3A:
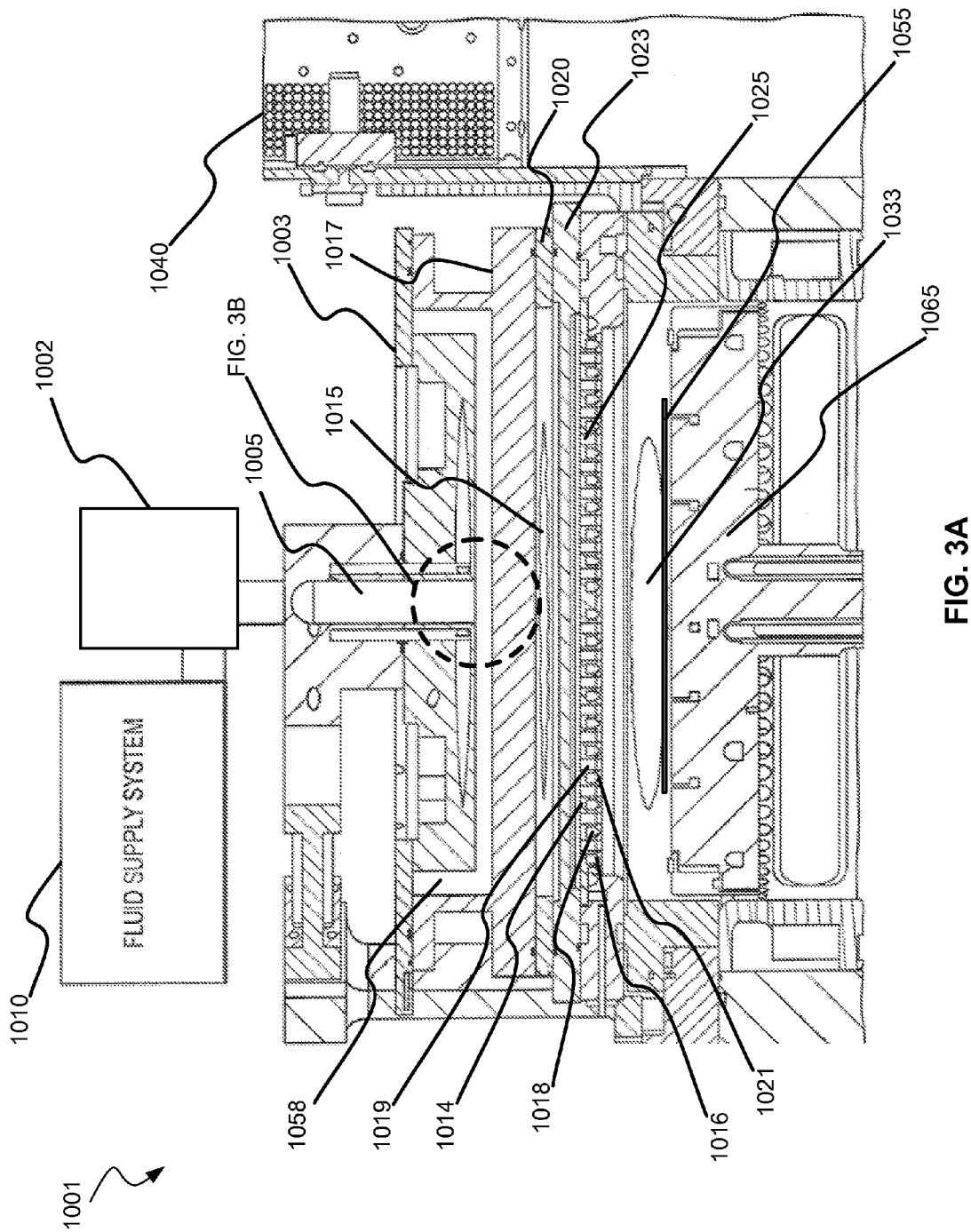
FIG. 3A shows a schematic cross-sectional view of a substrate processing chamber according to disclosed embodiments.

FIG. 3A shows a cross-sectional view of an exemplary substrate processing chamber 1001 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into chamber plasma region 1015 through a gas inlet assembly 1005. A remote plasma system (RPS) 1002 may optionally be included in the system, and may process a first gas which then travels through gas inlet assembly 1005. The inlet assembly 1005 may include two or more distinct gas supply channels where the second channel (not shown) may bypass the RPS 1002, if included. Accordingly, in disclosed embodiments the precursor gases may be delivered to the processing chamber in an unexcited state. In another example, the first channel provided through the RPS may be used for the process gas and the second channel bypassing the RPS may be used for a treatment gas in disclosed embodiments. The process gas may be excited within the RPS 1002 prior to entering the chamber plasma region 1015. Accordingly, the fluorine-containing precursor as discussed above, for example, may pass through RPS 1002 or bypass the RPS unit in disclosed embodiments. Various other examples encompassed by this arrangement will be similarly understood.

A cooling plate 1003, faceplate 1017, ion suppressor 1023, showerhead 1025, and a substrate support 1065 (also known as a pedestal), having a substrate 1055 disposed thereon, are shown and may each be included according to disclosed embodiments. The pedestal 1065 may have a heat exchange channel through which a heat exchange fluid flows to control the temperature of the substrate. This configuration may allow the substrate 1055 temperature to be cooled or heated to maintain relatively low temperatures, such as between about −20° C. to about 200° C., or therebetween. The heat exchange fluid may comprise ethylene glycol and/or water. The wafer support platter of the pedestal 1065, which may comprise aluminum, ceramic, or a combination thereof, may also be resistively heated in order to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 1065, which may be further configured to rotate.

The faceplate 1017 may be pyramidal, conical, or of another similar structure with a narrow top portion expanding to a wide bottom portion. The faceplate 1017 may additionally be flat as shown and include a plurality of through-channels used to distribute process gases. Plasma generating gases and/or plasma excited species, depending on use of the RPS 1002, may pass through a plurality of holes, shown in FIG. 3B, in faceplate 1017 for a more uniform delivery into the chamber plasma region 1015.

Exemplary configurations may include having the gas inlet assembly 1005 open into a gas supply region 1058 partitioned from the chamber plasma region 1015 by faceplate 1017 so that the gases/species flow through the holes in the faceplate 1017 into the chamber plasma region 1015. Structural and operational features may be selected to prevent significant backflow of plasma from the chamber plasma region 1015 back into the supply region 1058, gas inlet assembly 1005, and fluid supply system 1010. The structural features may include the selection of dimensions and cross-sectional geometries of the apertures in faceplate 1017 to deactivate back-streaming plasma. The operational features may include maintaining a pressure difference between the gas supply region 1058 and chamber plasma region 1015 that maintains a unidirectional flow of plasma through the showerhead 1025. The faceplate 1017, or a conductive top portion of the chamber, and showerhead 1025 are shown with an insulating ring 1020 located between the features, which allows an AC potential to be applied to the faceplate 1017 relative to showerhead 1025 and/or ion suppressor 1023. The insulating ring 1020 may be positioned between the faceplate 1017 and the showerhead 1025 and/or ion suppressor 1023 enabling a capacitively coupled plasma (CCP) to be formed in the first plasma region. A baffle (not shown) may additionally be located in the chamber plasma region 1015, or otherwise coupled with gas inlet assembly 1005, to affect the flow of fluid into the region through gas inlet assembly 1005.

The ion suppressor 1023 may comprise a plate or other geometry that defines a plurality of apertures throughout the structure that are configured to suppress the migration of ionically-charged species out of chamber plasma region 1015 while allowing uncharged neutral or radical species to pass through the ion suppressor 1023 into an activated gas delivery region between the suppressor and the showerhead. In disclosed embodiments, the ion suppressor 1023 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 1023 may provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiOFx:SiOCH etch ratios, etc.

The plurality of holes in the ion suppressor 1023 may be configured to control the passage of the activated gas, i.e., the ionic, radical, and/or neutral species, through the ion suppressor 1023. For example, the aspect ratio of the holes, or the hole diameter to length, and/or the geometry of the holes may be controlled so that the flow of ionically-charged species in the activated gas passing through the ion suppressor 1023 is reduced. The holes in the ion suppressor 1023 may include a tapered portion that faces chamber plasma region 1015, and a cylindrical portion that faces the showerhead 1025. The cylindrical portion may be shaped and dimensioned to control the flow of ionic species passing to the showerhead 1025. An adjustable electrical bias may also be applied to the ion suppressor 1023 as an additional means to control the flow of ionic species through the suppressor.

The ion suppression element 1023 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate is not always the desired goal. In many instances, ionic species are required to reach the substrate in order to perform the etch and/or deposition process. In these instances, the ion suppressor may help to control the concentration of ionic species in the reaction region at a level that assists the process.

Showerhead 1025 in combination with ion suppressor 1023 may allow a plasma present in chamber plasma region 1015 to avoid directly exciting gases in substrate processing region 1033, while still allowing excited species to travel from chamber plasma region 1015 into substrate processing region 1033. In this way, the chamber may be configured to prevent the plasma from contacting a substrate 1055 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which silicon oxide or silicon nitride etch may increase.

The processing system may further include a power supply 1040 electrically coupled with the processing chamber to provide electric power to the faceplate 1017, ion suppressor 1023, showerhead 1025, and/or pedestal 1065 to generate a plasma in the chamber plasma region 1015 or processing region 1033. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to chamber plasma region 1015. This in turn may allow development of particular plasma characteristics such that precursors may be dissociated in specific ways to enhance the etching profiles produced by these precursors.

A plasma may be ignited either in chamber plasma region 1015 above showerhead 1025 or substrate processing region 1033 below showerhead 1025. A plasma may be present in chamber plasma region 1015 to produce the radical-fluorine precursors from an inflow of the fluorine-containing precursor. An AC voltage typically in the radio frequency (RF) range may be applied between the conductive top portion of the processing chamber, such as faceplate 1017, and showerhead 1025 and/or ion suppressor 1023 to ignite a plasma in chamber plasma region 1015 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies. In the exemplary processing system the plasma may be provided by RF power delivered to faceplate 1017 relative to ion suppressor 1023 and/or showerhead 1025. The RF power may be between about 10 watts and about 5000 watts, between about 100 watts and about 2000 watts, between about 200 watts and about 1500 watts, or between about 200 watts and about 1000 watts in disclosed embodiments. The RF frequency applied in the exemplary processing system may be low RF frequencies less than about 200 kHz, high RF frequencies between about 10 MHz and about 15 MHz, or microwave frequencies greater than or about 1 GHz in disclosed embodiments. The plasma power may be capacitively-coupled (CCP) or inductively-coupled (ICP) into the remote plasma region.

Chamber plasma region 1015 (top plasma in figure) may be left at low or no power when a bottom plasma in the substrate processing region 1033 is turned on to, for example, cure a film or clean the interior surfaces bordering substrate processing region 1033. A plasma in substrate processing region 1033 may be ignited by applying an AC voltage between showerhead 1025 and the pedestal 1065 or bottom of the chamber. A treatment gas (such as argon) may be introduced into substrate processing region 1033 while the plasma is present to facilitate treatment of the patterned substrate. The showerhead 1025 may also be biased at a positive DC voltage relative to the pedestal 1065 or bottom of the chamber in order to accelerate positively charged ions toward patterned substrate 1055. In disclosed embodiments, the local plasma in substrate processing region 1033 may be struck by applying AC power via an inductively-coupled source while applying DC power by capacitively coupled means. As indicated previously, the local plasma power may be between about 10 watts and about 500 watts, between about 20 watts and about 400 watts, between about 30 watts and about 300 watts, or between about 50 watts and about 200 watts in embodiments of the invention.

A fluid, such as a precursor, for example a fluorine-containing precursor, may be flowed into the processing region 1033 by embodiments of the showerhead described herein. Excited species derived from the process gas in chamber plasma region 1015 may travel through apertures in the ion suppressor 1023, and/or showerhead 1025 and react with an additional precursor flowing into the processing region 1033 from a separate portion of the showerhead. Alternatively, if all precursor species are being excited in chamber plasma region 1015, no additional precursors may be flowed through the separate portion of the showerhead. Little or no plasma may be present in the processing region 1033 during the compound two-step etch. Excited derivatives of the precursors may combine in the region above the substrate and, on occasion, on the substrate to etch structures or remove species on the substrate in disclosed applications.

Exciting the fluids in the chamber plasma region 1015 directly, or exciting the fluids in the RPS units 1002, may provide several benefits. The concentration of the excited species derived from the fluids may be increased within the processing region 1033 due to the plasma in the chamber plasma region 1015. This increase may result from the location of the plasma in the chamber plasma region 1015. The processing region 1033 may be located closer to the chamber plasma region 1015 than the remote plasma system (RPS) 1002, leaving less time for the excited species to leave excited states through collisions with other gas molecules, walls of the chamber, and surfaces of the showerhead.

The uniformity of the concentration of the excited species derived from the process gas may also be increased within the processing region 1033. This may result from the shape of the chamber plasma region 1015, which may be more similar to the shape of the processing region 1033. Excited species created in the RPS 1002 may travel greater distances in order to pass through apertures near the edges of the showerhead 1025 relative to species that pass through apertures near the center of the showerhead 1025. The greater distance may result in a reduced excitation of the excited species and, for example, may result in a slower growth rate near the edge of a substrate. Exciting the fluids in the chamber plasma region

1015 may mitigate this variation for the fluid flowed through RPS 1002, or alternatively bypassed around the RPS unit.

The processing gases may be excited in chamber plasma region 1015 and may be passed through the showerhead 1025 to the processing region 1033 in the excited state. While a plasma may be generated in the processing region 1033, a plasma may alternatively not be generated in the processing region. In one example, the only excitation of the processing gas or precursors may be from exciting the processing gases in chamber plasma region 1015 to react with one another in the processing region 1033. As previously discussed, this may be to protect the structures patterned on the substrate 1055.

In addition to the fluid precursors, there may be other gases introduced at varied times for varied purposes, including carrier gases to aid delivery. A treatment gas may be introduced to remove unwanted species from the chamber walls, the substrate, the deposited film and/or the film during deposition. A treatment gas may be excited in a plasma and then used to reduce or remove residual content inside the chamber. In other disclosed embodiments the treatment gas may be used without a plasma. When the treatment gas includes water vapor, the delivery may be achieved using a mass flow meter (MFM), an injection valve, or by commercially available water vapor generators. The treatment gas may be introduced to the processing region 1033, either through the RPS unit or bypassing the RPS unit, and may further be excited in the first plasma region.

Figure 3B:
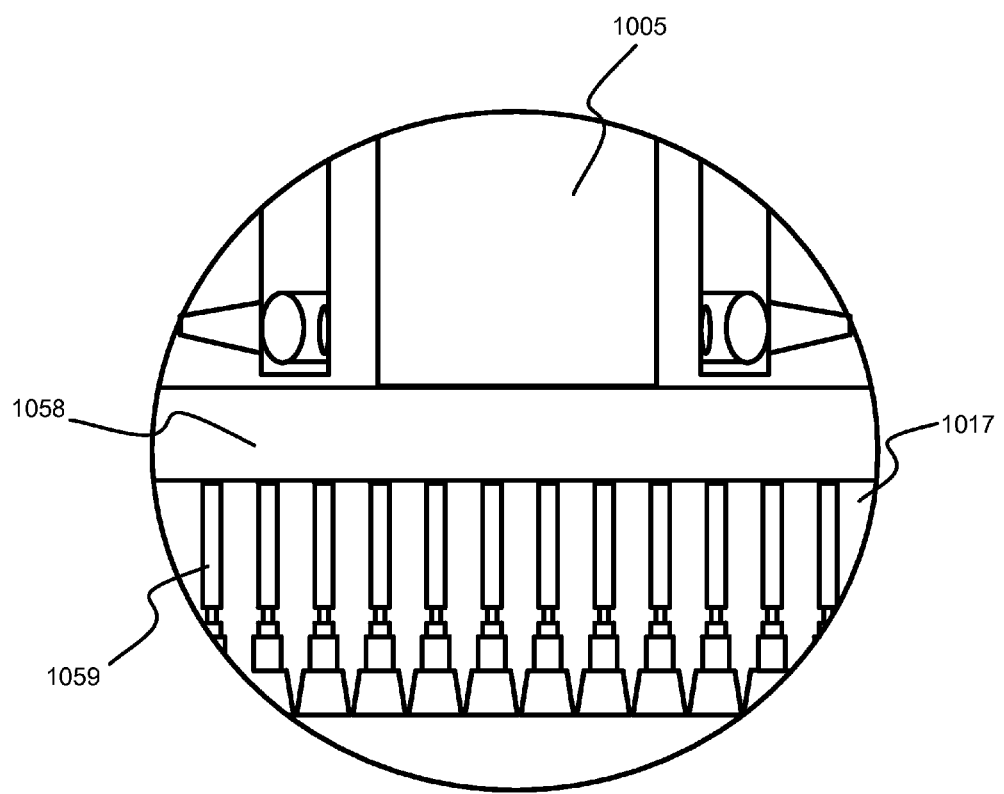
FIG. 3B shows a schematic cross-sectional view of a portion of a substrate processing chamber according to disclosed embodiments.

FIG. 3B shows a detailed view of the features affecting the processing gas distribution through faceplate 1017. As shown in FIG. 3A and FIG. 3B, faceplate 1017, cooling plate 1003, and gas inlet assembly 1005 intersect to define a gas supply region 1058 into which process gases may be delivered from gas inlet 1005. The gases may fill the gas supply region 1058 and flow to chamber plasma region 1015 through apertures 1059 in faceplate 1017. The apertures 1059 may be configured to direct flow in a substantially unidirectional manner such that process gases may flow into processing region 1033, but may be partially or fully prevented from backflow into the gas supply region 1058 after traversing the faceplate 1017.

Figure 3C:
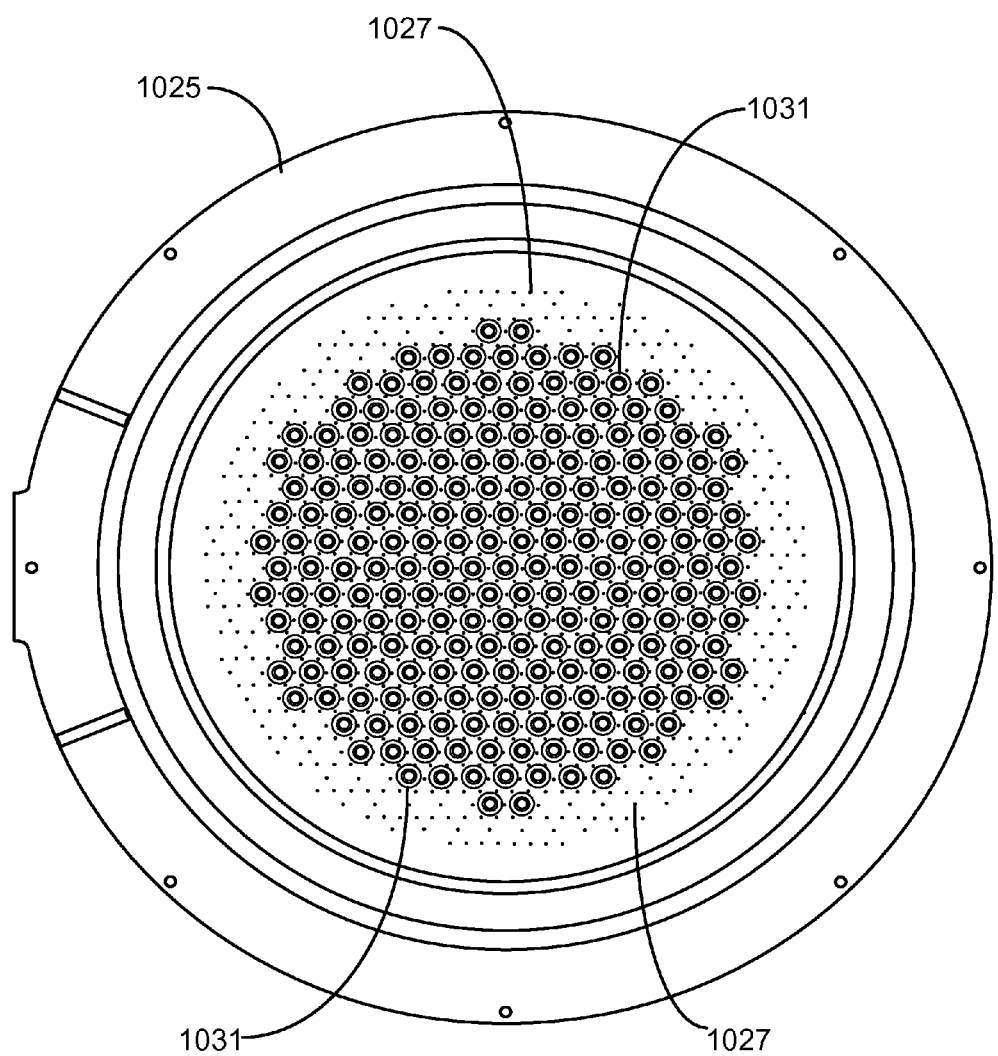
FIG. 3C shows a bottom plan view of a showerhead according to disclosed embodiments.

The gas distribution assemblies such as showerhead 1025 for use in the processing chamber section 1001 may be referred to as dual channel showerheads (DCSH) and are additionally detailed in the embodiments described in FIG. 3A as well as FIG. 3C herein. The dual channel showerhead may provide for etching processes that allow for separation of etchants outside of the processing region 1033 to provide limited interaction with chamber components and each other prior to being delivered into the processing region.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to the processing region 1033. For example, a perforated plate and tubes underneath the plate may be utilized, although other configurations may operate with reduced efficiency or not provide as uniform processing as the dual-channel showerhead as described.

In the embodiment shown, showerhead 1025 may distribute via first fluid channels 1019 process gases which contain plasma effluents upon excitation by a plasma in chamber plasma region 1015. In embodiments, the process gas introduced into the RPS 1002 and/or chamber plasma region 1015 may contain fluorine, e.g., $CF_4$, $NF_3$ or $XeF_2$. The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

FIG. 3C is a bottom view of a showerhead 1025 for use with a processing chamber according to disclosed embodiments. Showerhead 1025 corresponds with the showerhead shown in FIG. 3A. Through-holes 1031, which show a view of first fluid channels 1019, may have a plurality of shapes and configurations in order to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

An additional dual channel showerhead, as well as this processing system and chamber, are more fully described in patent application Ser. No. 13/251,714 filed on Oct. 3, 2011, which is hereby incorporated by reference for all purposes to the extent not inconsistent with the claimed features and description herein.

The chamber plasma region 1015 or a region in an RPS may be referred to as a remote plasma region. In embodiments, the radical precursor, e.g., a radical-fluorine precursor, is created in the remote plasma region and travels into the substrate processing region where it may or may not combine with additional precursors. Plasma power may essentially be applied only to the remote plasma region in disclosed embodiments.

Plasma effluents include a variety of molecules, molecular fragments and ionized species. In disclosed embodiments, both ammonia and nitrogen trifluoride are delivered to chamber plasma region 1015 to perform a Siconi™ etch during the second step (operations 120-140). Currently entertained theoretical mechanisms of Siconi™ etching may or may not be entirely correct but plasma effluents are thought to include $NH_4F$ and $NH_4F \cdot HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from substrate processing region 1033 by a vacuum pump. A thin continuous or discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the lower plate 1016 is heatable by incorporating a heating element within lower plate 1016. The substrate may be heated by reducing the distance between the substrate and the heated lower plate. Lower plate 1020 may be heated to between about 100° C. and 150° C., between about 110° C. and 140° C. or between about 120° C. and 130° C. in disclosed embodiments. By reducing the separation between the substrate and the heated gas delivery plate, the substrate may be heated to above about 75° C., above about 90° C., above about 100° C.

or between about 115° C. and about 150° C. in disclosed embodiments. The heat radiated from lower plate 1016 to the substrate should be made sufficient to dissociate or sublimate solid $(NH_4)_2SiF_6$ on the substrate into volatile $SiF_4$, $NH_3$ and HF products which may be pumped away from substrate processing region 1033. Other methods of imparting heat to the substrate may also be used.

Nitrogen trifluoride (or another fluorine-containing precursor) may be flowed into chamber plasma region 1015 at rates between about 5 sccm and about 500 sccm, between about 10 sccm and about 150 sccm, or between about 25 sccm and about 125 sccm in disclosed embodiments. When a hydrogen-containing precursor is used, ammonia (or hydrogen-containing precursors in general) may be flowed into chamber plasma region 1015 at rates between about 5 sccm and about 800 sccm, between about 20 sccm and about 300 sccm, or between about 50 sccm and about 250 sccm in disclosed embodiments.

Combined flow rates of precursors into the chamber may account for 0.05% to about 20% by volume of the overall gas mixture; the remainder being carrier gases. The fluorine-containing precursor may be flowed into the remote plasma region, but the plasma effluents may have the same volumetric flow ratio in embodiments. In the case of the fluorine-containing precursor, a purge or carrier gas may be first initiated into the remote plasma region before the fluorine-containing gas to stabilize the pressure within the remote plasma region. Substrate processing region 1033 can be maintained at a variety of pressures during the flow of precursors, any carrier gases, and plasma effluents into substrate processing region 1033. The pressure may be maintained between about 0.1 mTorr and about 100 Torr, between about 1 Torr and about 20 Torr or between about 1 Torr and about 5 Torr in disclosed embodiments.

Figure 4:
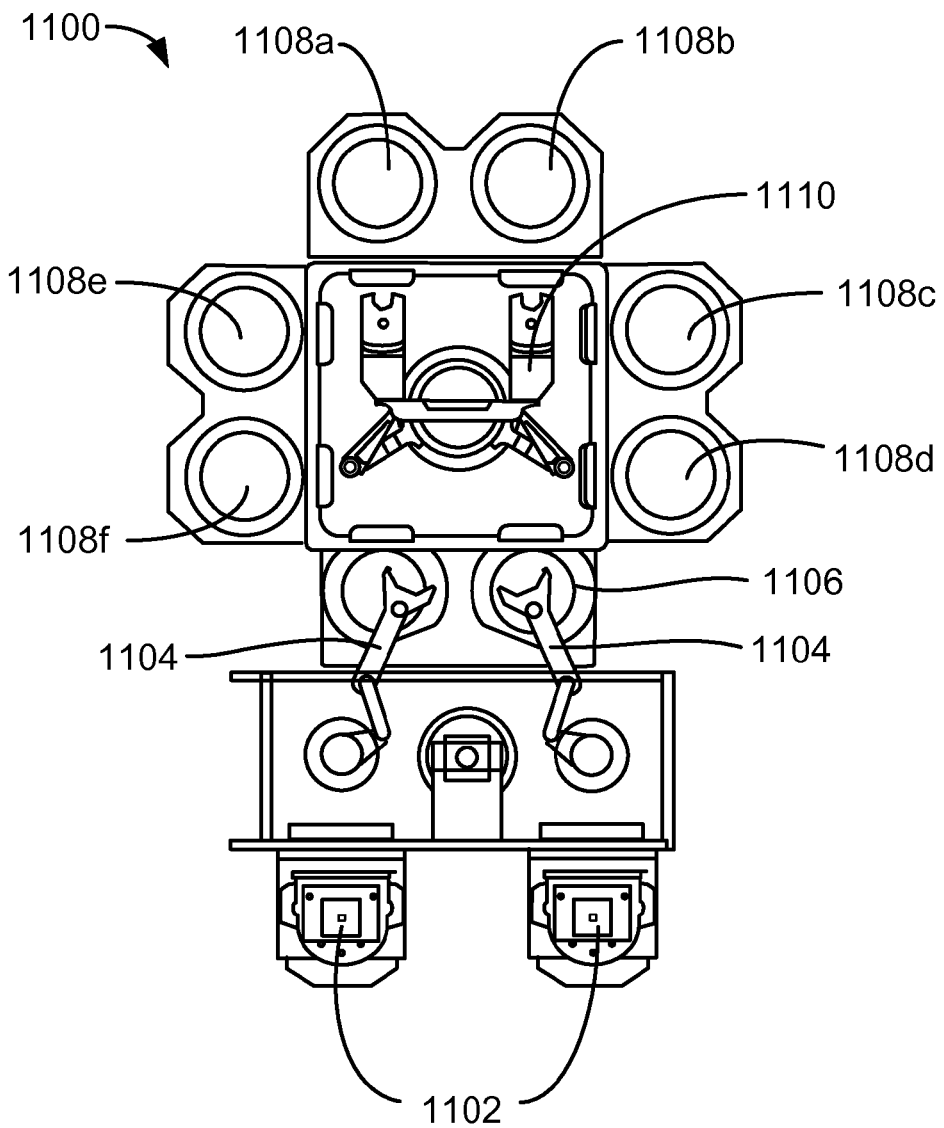
FIG. 4 shows a top plan view of an exemplary substrate processing system according to disclosed embodiments.

Embodiments of the deposition systems may be incorporated into larger fabrication systems for producing integrated circuit chips. FIG. 4 shows one such processing system 1101 of deposition, etching, baking, and curing chambers according to disclosed embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108*a-f*. A second robotic arm 1110 may be used to transport the substrate wafers from the holding area 1106 to the substrate processing chambers 1108*a-f* and back. Each substrate processing chamber 1108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 1108*a-f* may include one or more system components for depositing, annealing, curing and/or etching a dielectric film on the substrate wafer. In one configuration, two pairs of the processing chamber, e.g., 1108*c-d* and 1108*e-f*, may be used to deposit dielectric material on the substrate, and the third pair of processing chambers, e.g., 1108*a-b*, may be used to etch the deposited dielectric. In another configuration, all three pairs of chambers, e.g., 1108*a-f*, may be configured to etch a dielectric film on the substrate. Any one or more of the processes described may be carried out in chamber(s) separated from the fabrication system shown in disclosed embodiments.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen, carbon and the like. Exposed "silicon" may consist only of silicon. Exposed "titanium nitride" of the patterned substrate is predominantly $Ti_xN_y$, but may include minority concentrations of other elemental constituents such as nitrogen, oxygen, hydrogen, carbon and the like. "Exposed titanium nitride" may consist only of titanium and nitrogen. Exposed "silicon oxide" of the patterned substrate is predominantly $SiO_2$ but may include minority concentrations of other elemental constituents such as nitrogen, hydrogen, carbon and the like. In some embodiments, silicon oxide films etched using the methods disclosed herein consist of silicon and oxygen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" are radical precursors which contain fluorine but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of removing a fluorocarbon layer from a low-k dielectric layer on a patterned substrate, the method comprising two sequential steps:
   (i) treating the patterned substrate with a local plasma formed from a silicon-and-fluorine-containing precursor, wherein the operation of treating the patterned substrate removes the fluorocarbon layer from patterned substrate and forms a fluorinated silicon oxide layer on the low-k dielectric layer and the local plasma is formed by applying a local plasma power;
   (ii) flowing a fluorine-containing precursor into a remote plasma region fluidly coupled to a substrate processing region while forming a remote plasma in the remote plasma region to produce plasma effluents, wherein forming the remote plasma in the remote plasma region to produce the plasma effluents comprises striking an RF plasma having an RF plasma power to the plasma region; and etching the fluorinated silicon oxide layer by flowing the plasma effluents into the substrate processing region.

2. The method of claim 1 wherein the silicon-and-fluorine-containing precursor comprises silicon tetrafluoride.

3. The method of claim 1 wherein the substrate processing region is devoid of oxygen during sequential step (i).

4. The method of claim 1 wherein the substrate processing region is devoid of nitrogen during sequential step (i).

5. The method of claim 1 wherein the local plasma power is between about 10 watts and about 500 watts to the substrate processing region.

6. The method of claim 1 wherein forming a remote plasma in the remote plasma region to produce plasma effluents comprises applying RF power between about 1 watts and about 5000 watts to the remote plasma region.

7. The method of claim 1 wherein the local plasma is formed by applying a DC bias power such that the local plasma power comprises both an AC portion and a DC portion.

8. The method of claim 1 wherein the DC bias power comprises applying a DC bias voltage greater than 200 volts to accelerate inert gas ions toward the patterned substrate.

9. The method of claim 1 wherein the plasma effluents enter the substrate processing region through through-holes in a showerhead which separates the remote plasma region from the substrate processing region.

10. The method of claim 1 wherein the remote plasma region is devoid of hydrogen during sequential step (ii).

11. The method of claim 1 wherein the fluorine-containing precursor comprises nitrogen trifluoride.

12. The method of claim 1 wherein step (ii) further comprises flowing a hydrogen-containing precursor into the remote plasma region.

13. The method of claim 12 wherein the hydrogen-containing precursor comprises ammonia ($NH_3$).

14. The method of claim 12 wherein step (ii) further comprises forming solid residue etch by-product on the surface of the patterned substrate.

15. The method of claim 14 further comprising a step (iii) which comprises after raising a temperature of the patterned substrate step above 90° C. to sublimate the solid residue, wherein step (iii) occurs after step (ii).

16. The method of claim 12 wherein forming a remote plasma in the remote plasma region to produce plasma effluents comprises applying RF power between about 10 watts and about 300 watts to the remote plasma region.

17. The method of claim 1 wherein a pressure within the substrate processing region is between about 0.01 Torr and about 50 Torr during sequential step (ii).

* * * * *